United States Patent
Sung et al.

(10) Patent No.: US 9,236,308 B1
(45) Date of Patent: Jan. 12, 2016

(54) METHODS OF FABRICATING FIN STRUCTURES OF UNIFORM HEIGHT

(71) Applicant: GLOBALFOUNDRIES Inc., Grand Cayman, KY (US)

(72) Inventors: Min Gyu Sung, Latham, NY (US); Kwan-Yong Lim, Niskayuna, NY (US); Sukwon Hong, Loudonville, NY (US)

(73) Assignee: GLOBALFOUNDRIES INC., Cayman Islands (KY)

( * ) Notice: Subject to any disclaimer, the term of this patent is extended or adjusted under 35 U.S.C. 154(b) by 0 days.

(21) Appl. No.: 14/463,013

(22) Filed: Aug. 19, 2014

(51) Int. Cl.
  *H01L 21/8242* (2006.01)
  *H01L 21/8234* (2006.01)
  *H01L 21/3105* (2006.01)
  *H01L 21/306* (2006.01)
  *H01L 21/311* (2006.01)
  *H01L 29/66* (2006.01)

(52) U.S. Cl.
  CPC .. *H01L 21/823431* (2013.01); *H01L 21/30625* (2013.01); *H01L 21/31051* (2013.01); *H01L 21/31116* (2013.01); *H01L 29/66818* (2013.01)

(58) Field of Classification Search
  CPC ................................................ H01L 29/66818
  See application file for complete search history.

(56) References Cited

U.S. PATENT DOCUMENTS

| | | | |
|---|---|---|---|
| 2011/0084340 A1* | 4/2011 | Yuan et al. | 257/368 |
| 2011/0095372 A1* | 4/2011 | Yuan et al. | 257/368 |
| 2013/0181263 A1* | 7/2013 | Cai et al. | 257/288 |
| 2013/0244387 A1* | 9/2013 | Cho | 438/283 |
| 2014/0117462 A1* | 5/2014 | Cheng et al. | 257/410 |
| 2014/0227857 A1* | 8/2014 | Youn et al. | 438/427 |

\* cited by examiner

*Primary Examiner* — Angel Roman
(74) *Attorney, Agent, or Firm* — Heslin, Rothenberg, Farley & Mesiti P.C.

(57) ABSTRACT

Methods of fabricating fin structures having exposed upper fin portions with a uniform exposure height are disclosed herein. The fabrication methods include providing a substrate with plurality of fins and a dielectric material disposed between and over the plurality of fins, planarizing the dielectric material and the plurality of fins, and uniformly recessing the dielectric material to a pre-selected depth below upper surfaces of the plurality of fins to expose upper fin portions. The exposed upper fin portions, as a result of uniformly recessing the dielectric material, have a uniform exposure height above the recessed dielectric material. A protective film may be provided over the recessed dielectric material and exposed upper fin portions to preserve the uniform exposure height of the upper fin portions. The uniform exposure height of the exposed upper fin portions facilitates subsequent formation of one or more circuit structures above the substrate.

18 Claims, 5 Drawing Sheets

METHODS OF FABRICATING FIN STRUCTURES OF UNIFORM HEIGHT

FIELD OF THE INVENTION

The present invention generally relates to fabricating circuit structures, and more specifically, to fin structures and methods of fabrication thereof.

BACKGROUND

Fin field-effect transistor (FinFET) devices continue to be developed to replace conventional planar metal oxide semiconductor field-effect transistors (MOSFETs) in advanced complementary metal oxide semiconductor (CMOS) technology. As is known, the term "fin" refers to a generally vertically-oriented structure within or upon which are formed, for instance, one or more FinFETs or other fin devices, such as passive devices, including capacitors, diodes, etc. Demands for smaller device sizes and challenges in fabricating FinFETS with uniform physical and electrical properties continue to drive development of new techniques of fin fabrication.

SUMMARY OF THE INVENTION

The shortcomings of the prior art are overcome and additional advantages are provided through the provision, in one aspect, of a method including: providing a substrate including a plurality of fins extending above the substrate, and a dielectric material disposed between and over the plurality of fins; planarizing the dielectric material and the plurality of fins; uniformly recessing the dielectric material to a pre-selected depth below upper surfaces of the plurality of fins to expose upper fin portions of the plurality of fins, the exposed upper fin portions of the plurality of fins having a uniform exposure height above the recessed dielectric material; and forming one or more circuit structures above the substrate using, in part, the plurality of fins, wherein the uniform exposure height of the exposed upper fin portions facilitates forming the one or more circuit structures.

Additional features and advantages are realized through the techniques of the present invention. Other embodiments and aspects are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Reference is made below to the drawings, which are not drawn to scale for ease of understanding, wherein the same reference numbers used throughout different figures designate the same or similar components.

Figure 1A:
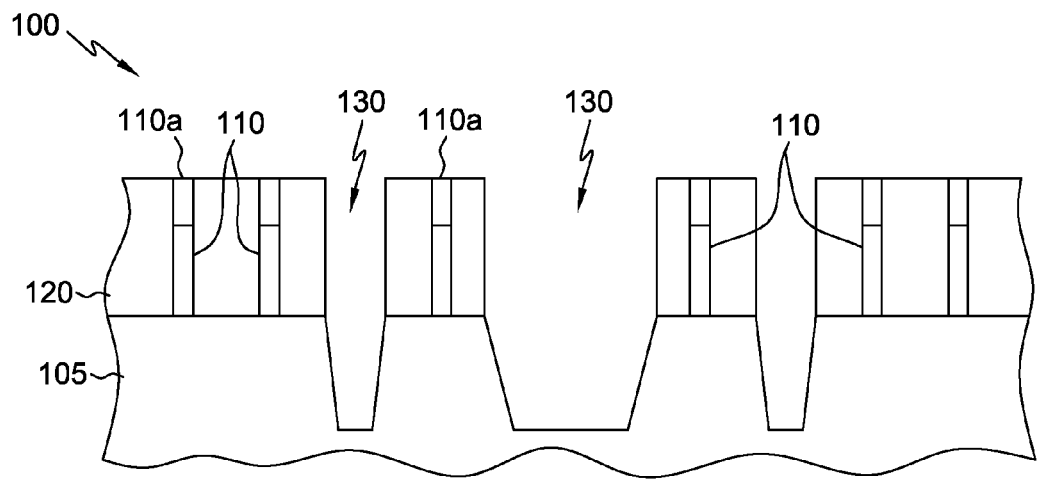
FIGS. 1A-1C depict one embodiment of at least part of a process for forming one or more circuit structures, illustrating problems to be addressed by processing in accordance with one or more aspects of the present invention herein.

FIG. 1A depicts a cross-sectional view of a portion of one embodiment of a structure 100 at an intermediate fabrication step, illustrating conventional circuit structure fabrication methods. Structure 100 includes a substrate 105 that includes one or more fins 110 above the substrate and a first dielectric material 120 disposed between or around the one or more fins 110. Fins 110 may, in general, be formed by applying a patterned mask 110a, such as a patterned silicon nitride hard mask, over a bulk semiconductor substrate, such as a silicon wafer, and etching fins 110. Following fin etching, a first dielectric material 120 may be disposed between fins 110 to, in part, electrically isolate fins 110 from each other. Fabrication techniques for many circuit structures, such as SRAM unit cells, include a "fin cutting" step to remove portions of certain fins, or entirely removing other fins, to form trenches 130 in substrate 105. As discussed below, trenches 130 are formed to form, in part, isolation trenches between fins within a single circuit structure, and/or between two or more separate circuit structures on the same substrate 105.

Figure 1B:
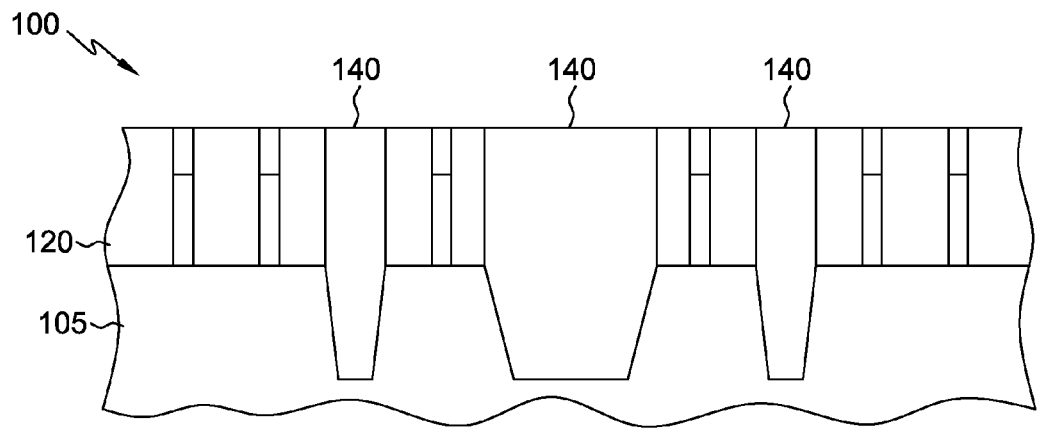
Figure 1C:
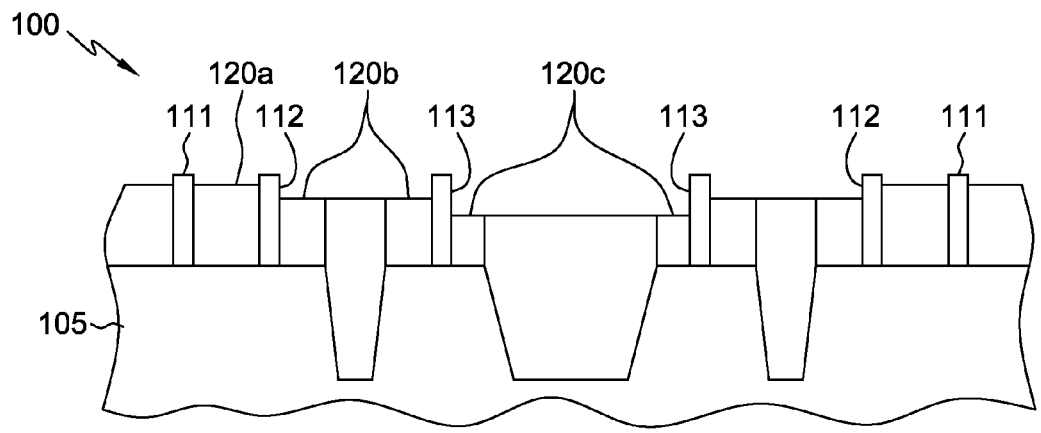

FIG. 1B depicts structure 100 following disposal of a second dielectric material 140 in the trenches 130 of FIG. 1A. Second dielectric material 140 is disposed in the trenches to form isolation trenches that electrically isolate separate circuit structures, such as two adjacent transistors formed in the same substrate, or that electrically isolate features within a single circuit structure, such as a p-type FinFET and an n-type FinFET within a single transistor. Second dielectric material 140 may be the same material as first dielectric material 120. Although first and second dielectric materials 120 and 140 need not be identical materials, the first and second dielectric materials are generally both susceptible to the same recessing technique so that both may be recessed in a single step, as illustrated by FIG. 1C and described below. Generally both first dielectric material 120 and second dielectric material 140 are different type of materials from the material of patterned mask 110a, so that fabrication steps that may affect first and second dielectric materials 120 and 140, such as recessing first and second dielectric materials, do not affect patterned mask 110a and vice versa.

FIG. 1C depicts structure 100 following exposure of upper fin portions 111, 112, 113 of the fins via recession of first dielectric material 120 and second dielectric material 140, as well as removal of remaining patterned mask 110a. Recession of first and second dielectric materials 120, 140 may be accomplished, for example, by etching first and second dielectric materials 120, 140 at an etch rate that depends on a spacing or "pitch" between fins. For example, common dry etching techniques may recess dielectric material 120 at a slower rate between two fins separated by a relatively small pitch, such as between fins 111 and 112 in FIG. 1C, while the same dry etching process may recess first and second dielectric materials 120, 140 more rapidly between two fins separated by a relatively large pitch, as between fins 112 and 113. Thus, the same recessing process may result in unequal recession of first dielectric material 120a, 120b, 120c between different pairs of fins, further resulting in upper fin portions 111, 112, and 113 having unequal heights above the first dielectric material.

In subsequent processing steps, a gate material may be formed over upper fin portions 111, 112, 113 to form FinFET structures, defining, in part, one or more circuit structures. As the gate material generally only contacts the exposed upper fin portions of the one or more fins, the physical sizes of exposed upper fin portions 111, 112, 113 define the channel sizes of the formed FinFET structures. Consequently, the uneven sizes of upper fin portions 111, 112, 113 result in FinFET structures with different physical and electrical properties. In particular the FinFET structures may have variable channel sizes of the FinFET structures and, consequently, variable threshold voltages for operation of the FinFETs within a single circuit structure and among separate circuit structures, resulting in circuit structures with sub-optimal or undesirably variable performance. Thus, there is a need for novel methods for fabricating fins having exposed upper fin portions with uniform exposure heights. Ideally, fins having uniform exposure heights may be achieved using existing fabrication tools and materials to reduce fabrication costs associated with newer tools.

Generally stated, provided herein in one aspect is a method including: providing a substrate including a plurality of fins extending above the substrate, and a dielectric material disposed between and over the plurality of fins; planarizing the dielectric material with the plurality of fins; uniformly recessing the dielectric material to a pre-selected depth below upper surfaces of the plurality of fins to expose upper fin portions of the plurality of fins, the exposed upper fin portions of the plurality of fins having a uniform exposure height above the recessed dielectric material; and forming one or more circuit structures above the substrate using, in part, the plurality of fins, wherein the uniform exposure height of the exposed upper fin portions facilitates forming the one or more circuit structures.

FIGS. 2A-2I depict one embodiment of such an approach to, in part, achieve a uniform exposure height of upper fin portions, in accordance with one or more aspects of the present invention.

Figure 2A:
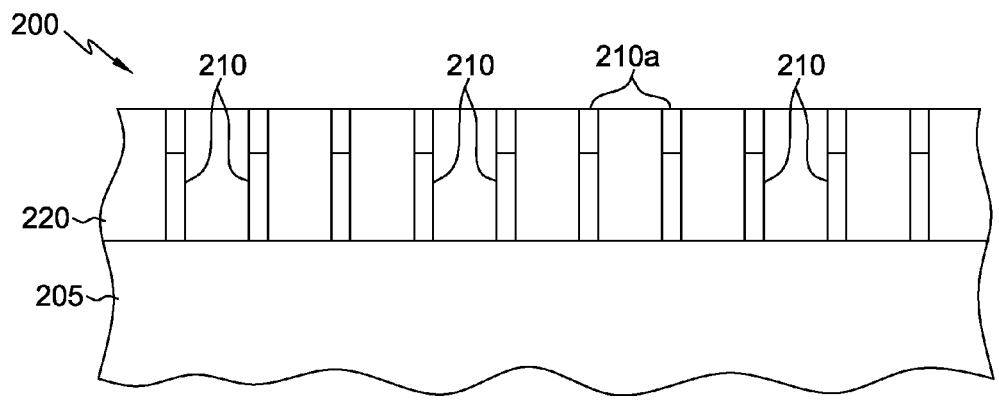
FIGS. 2A-2I depict one embodiment of a method of forming circuit structures using, in part, a plurality of fin structures, in which upper portions of the plurality of fin structures have a uniform height to facilitate forming the circuit structures, in accordance with one or more aspects of the present invention.

FIG. 2A depicts a cross-section of at least a portion of one embodiment of a structure 200 including a substrate 205, a plurality of fins 210 formed above substrate 205, and a dielectric material 220 disposed between the plurality of fins 210. The plurality of fins 210 may be formed, for example, by providing a patterned mask 210a, such as a patterned hard mask, over a semiconductor substrate 205 and using the patterned mask 210a to etch the plurality of fins 210 in the substrate 205. Patterned mask 210a may, in one example, be a patterned silicon nitride hard mask. Forming the plurality of fins 210 may result in the plurality of fins 210 having a uniform fin height above substrate 205. The plurality of fins 210 may, in one example, be planarized prior to providing dielectric material 220 between plurality of fins 210 and prior to planarizing dielectric material 220 in order to achieve a uniform fin height of the plurality of fins 210. Forming the plurality of fins may also result in the plurality of fins 210 having a uniform pitch size separating the plurality of fins 210. Dielectric material 220 may, in one example, be an oxide material such as silicon dioxide. Dielectric material 220 may, at least initially, be disposed between and over the plurality of fins 210, and may subsequently be planarized along with the plurality of fins 210, as illustrated in FIG. 2A. Planarizing dielectric material 220 may include, for example, a chemical-mechanical polishing (CMP) terminating when the dielectric is co-planar with upper surfaces of the plurality of fins 210. For example, the upper surfaces of the plurality of fins 210 may include patterned mask 210a, and the chemical-mechanical polishing may terminate when dielectric material 220 is coplanar with the patterned mask 210a.

Figure 2B:
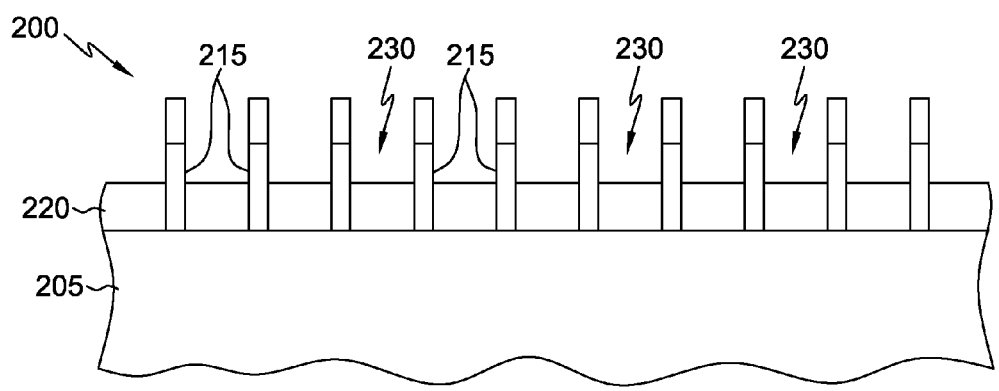

FIG. 2B depicts the structure 200 of FIG. 2A following uniformly recessing the dielectric material 220 to a pre-selected depth 230 below upper surfaces of the plurality of fins 210 (FIG. 2A) to expose upper fin portions 215 of the plurality of fins 210. The exposed upper fin portions 215 have a uniform exposure height above the recessed dielectric material 220. Uniformly recessing the dielectric material 220 may include, for example, recessing the dielectric material at a uniform recession rate that is dependent, in part, on a pitch size separating the plurality of fins 210. For example, uniformly recessing dielectric material 220 may include a reactive-ion etching (RIE) of dielectric material 220. If, as in the exemplary embodiment depicted in FIGS. 2A-2B, the pitch size of the plurality of fins 210 is a uniform pitch size, the uniform pitch size may facilitate uniformly recessing dielectric material 220 at the uniform recession rate. Thus, by recessing dielectric material 220 when the pitch separating plurality of fins 210 is a uniform pitch size, exposed upper fin portions 215 may have a uniform exposure height above recessed dielectric material 220. As well, in exemplary embodiments the plurality of fins 210 of FIG. 2A have a uniform fin height above substrate 205, so that the uniform fin height facilitates forming upper fin portions 215 to a uniform exposure height.

Figure 2C:
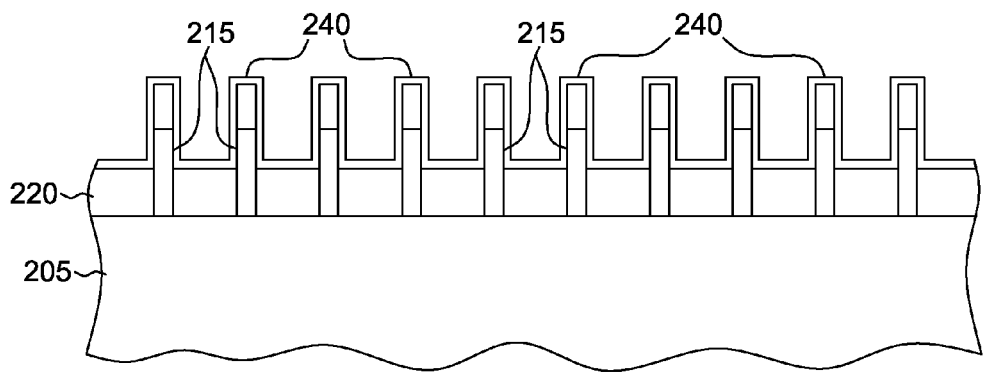

FIG. 2C depicts the structure 200 of FIG. 2B with a protective film 240 provided over exposed upper fin portions 215 and recessed dielectric material 220. Protective film 240 may be provided in exemplary embodiments to protect recessed dielectric material 220 and upper fin portions 215 during subsequent processing steps, as described herein below. As a uniform exposure height of upper fin portions 215 is achieved through uniformly recessing dielectric material 220, protective film 240 facilitates preserving the uniform exposure height in the subsequent forming of one or more circuit structures.

Figure 2D:
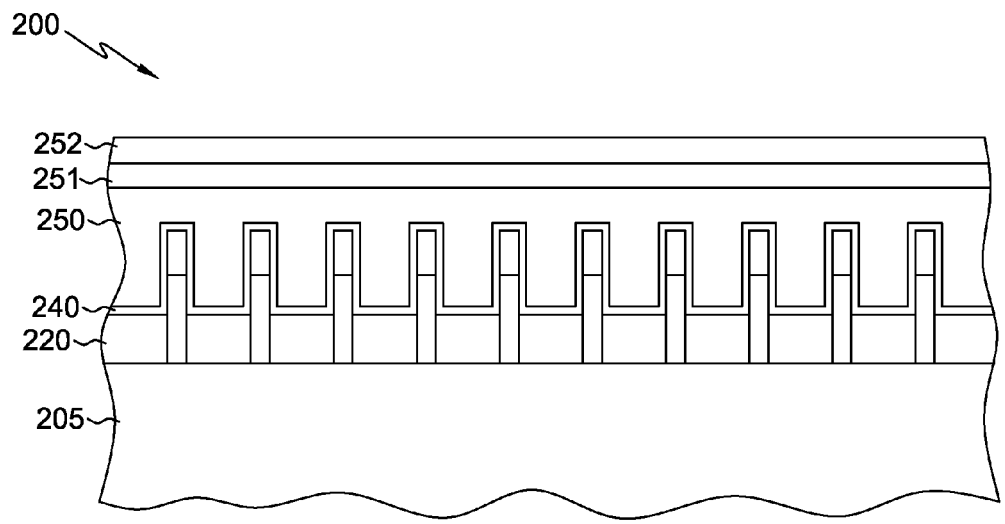
Figure 2E:
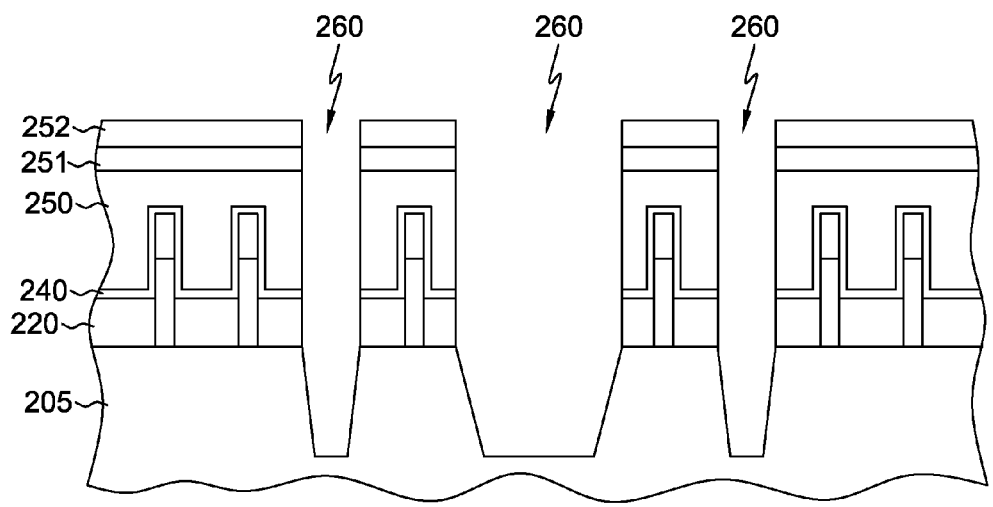

FIGS. 2D-2E depict the structure 200 of FIG. 2C undergoing removal of at least a portion of one or more of the plurality of fins 210 to form one or more trenches in substrate 205. Removal of at least a portion of one or more of the plurality of fins 210 may, in at least one embodiment, include etching through at least a portion of one or more of the plurality of fins and a portion of the substrate. In exemplary embodiments including protective film 240, the etching also removes a portion of the protective film 240 over the at least a portion of the one or more of the plurality of fins 210. The etching may include, for example, lithographic etching of the fin portion and the portion of the substrate as illustrated in FIGS. 2D-2E. Lithographic etching may begin, as in FIG. 2D, by deposition of an organic material layer 250, an anti-reflective coating layer 251, and photo-resist layer 252 over the plurality of fins 210 and dielectric material 220, as well as protective film 240. Photo-resist layer 252 may be patterned to expose portions of the underlying layers, and the exposed portions may be etched by irradiation to form trenches 260, as depicted in FIG. 2E. Protective film 240, as well as dielectric material 220 and substrate 205, ideally are made of materials susceptible to lithographic etching. Portions of protective film 240 thus may also be removed by etching, and protective film 240 does not prevent the removal of at least a portion of one or more of the plurality of fins 210 and formation of one or more trenches 260.

Figure 2F:
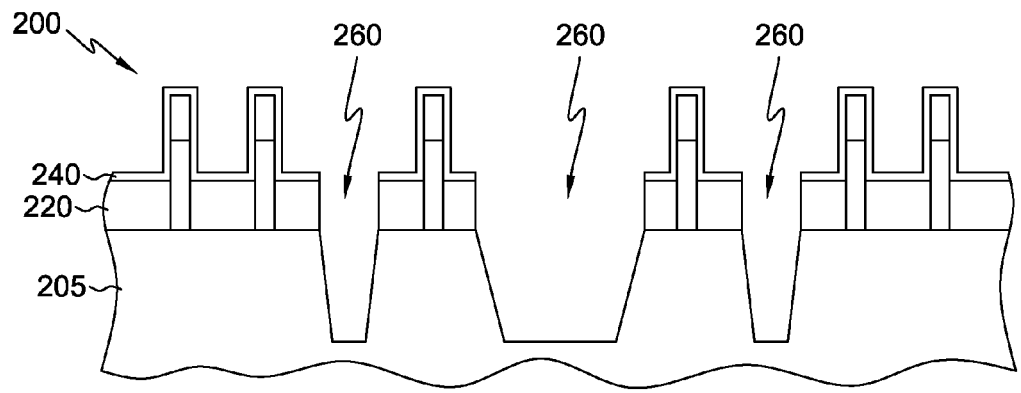

FIG. 2F depicts the structure 200 of FIG. 2E following formation of trenches 260 and removal of layers 250, 251, 252 from over protective film 240. Removal of layers 250, 251, 252 may be accomplished by any method that removes an organic layer 250, anti-reflective coating layer 251, and photo-resist layer 252 without etching or affecting protective layer 240, dielectric layer 220 and substrate 205.

Figure 2G:
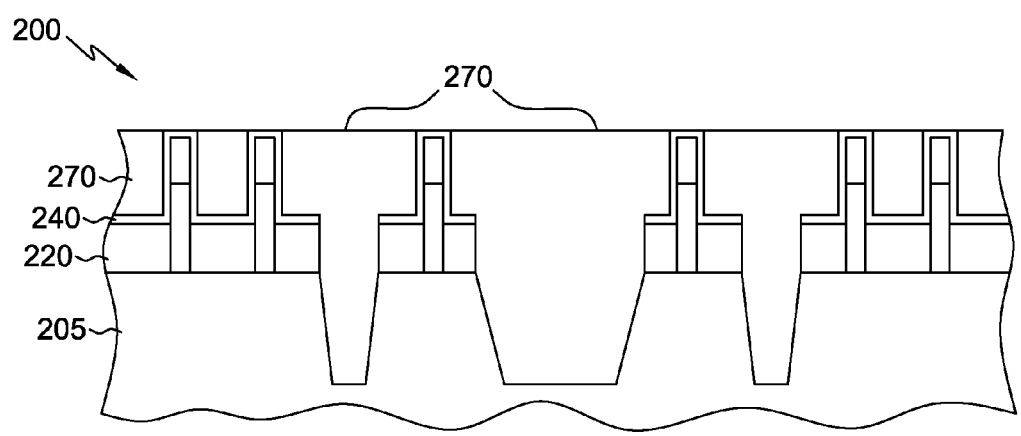

FIG. 2G depicts the structure 200 of FIG. 2F following deposition of a second dielectric material 270. In exemplary embodiments, dielectric material 220 may be a first dielectric material, and a second dielectric material 270 may be provided to fill the one or more trenches 260 (FIG. 2F) to form isolation trenches of and/or between one or more circuit structures formed above substrate 205. Second dielectric material 270 and first dielectric material 220 may be the same type of material, such as an oxide material. In one example, providing second dielectric material 270 may include planarizing the second dielectric material 270 with an upper surface of the protective film 240 over the plurality of fins 210. For instance, second dielectric material 270 may be planarized by chemical-mechanical polishing that terminates when second dielectric material 240 is co-planar with the upper surface of protective film 240.

Figure 2H:
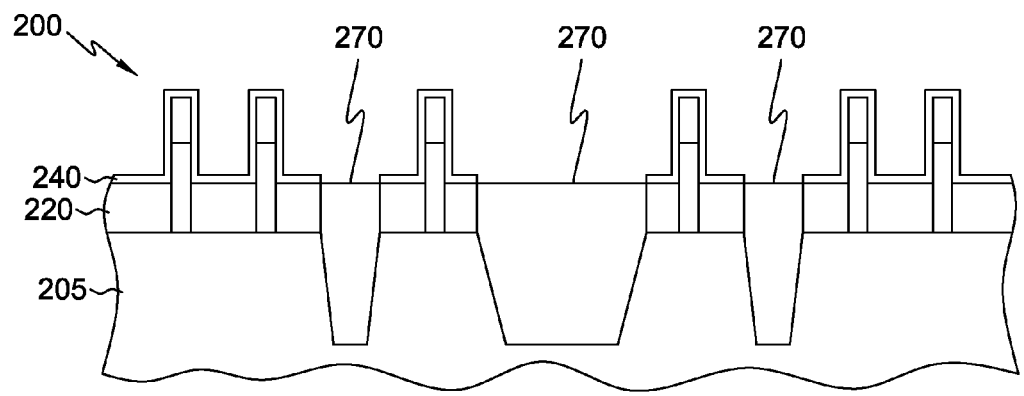

FIG. 2H depicts structure 200 of FIG. 2G following recessing second dielectric material 270, in which the recessing does not further recess first dielectric material 220. The recess depth of second dielectric material can be deeper, so that top level of second dielectric material can be lower than that of first dielectric material. In exemplary embodiments including protective film 240, second dielectric material 270 and protective film 240 are different materials such that protective film 240 is not susceptible to recessing of second dielectric material 270, so that first dielectric material 220 beneath protective film 240 is protected from the recessing of the second dielectric material 270. For example, protective film 240 may be a nitride material, such as silicon nitride, and second dielectric material 270 may be an oxide material, such as silicon dioxide. Recessing techniques that affect oxide materials, such as a reactive-ion etch (RIE) process configured to etch oxide materials, generally do not similarly affect or etch nitride materials and vice versa, thus protective film 240 preserves first dielectric material 220 and upper fin portions of the plurality of fins 210 during recessing of second dielectric material 270. In exemplary embodiments, second dielectric material 270 may be recessed to a depth below protective film 240, as illustrated in FIG. 2H, and second dielectric material 270 may be further recessed below upper surfaces of first dielectric material 220.

Figure 2I:
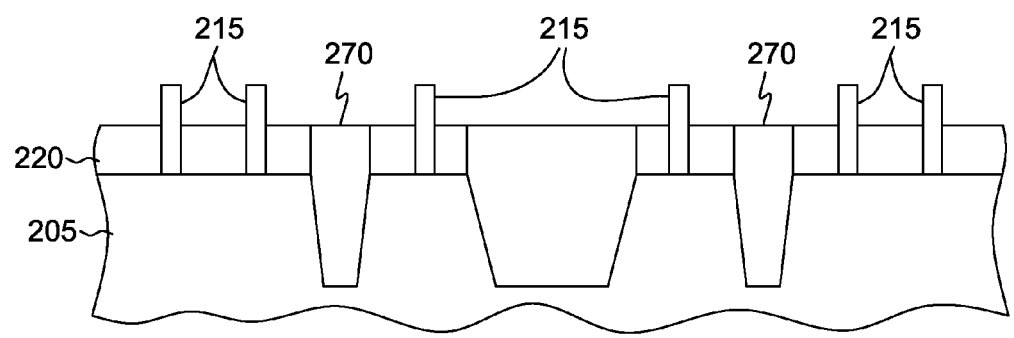

FIG. 2I depicts structure 200 of FIG. 2H following removal of protective film 240, as well as patterned mask 210a (FIG. 2A) if present, after recession of the second dielectric material, exposing upper fin portions 215 of the plurality of fins. Upper fin portions 215, as illustrated in FIG. 2I, have a uniform exposure height above the recessed first dielectric material 210. In subsequent circuit structure fabrication steps, a plurality of gate structures (not depicted in FIG. 2I) may be provided over the exposed upper fin portions 215 to facilitate forming a plurality of FinFET structures. Generally in any single FinFET structure of a circuit structure, an exposed upper fin portion of a fin defines the channel size of the FinFET; the remaining portion of the fin within the dielectric material may not affect the FinFET channel size. As depicted in the exemplary embodiment of FIG. 2I, the uniform exposure height of upper fin portions 215 defines a uniform channel size for the plurality of FinFET structures formed, at least in part, by provision of a plurality of gate structures over the exposed fin portions. Thus, the exemplary embodiment of the fin formation approach depicted in FIGS. 2A-2I may achieve a uniform channel size for FinFET structures, as may be desired for many types of circuit structures. For example, in many circuit structures it is desirable for the gate structures of multiple FinFET structures to have a uniform threshold voltage for operation of the circuit structure. Such a uniform threshold voltage may be ideally achieved by ensuring a uniform channel size, defined by the upper fin portions, beneath the gate structures.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

What is claimed is:

1. A method comprising:
   providing a substrate comprising a plurality of fins extending above the substrate, and a dielectric material disposed between and over the plurality of fins, the plurality of fins being planarized to have a uniform fin height above the substrate;

thereafter, planarizing the dielectric material;
uniformly recessing the dielectric material to a pre-selected depth below upper surfaces of the plurality of fins to expose upper fin portions of the plurality of fins, the exposed upper fin portions of the plurality of fins having a uniform exposure height above the recessed dielectric material, wherein the uniform fin height facilitates the uniformly recessing; and
forming one or more circuit structures above the substrate using, in part, the plurality of fins, wherein the uniform exposure height of the exposed upper fin portions facilitates forming the one or more circuit structures.

2. The method of claim 1, wherein uniformly recessing the dielectric material comprises recessing the dielectric material at a uniform recession rate, the uniform recession rate being dependent, in part, on a pitch size separating the plurality of fins.

3. The method of claim 2, wherein the pitch size is a uniform pitch size, the uniform pitch size facilitating uniformly recessing the dielectric material at the uniform recession rate.

4. The method of claim 1, wherein planarizing the dielectric material comprises a chemical-mechanical polishing terminating when the dielectric material is co-planar with the upper surfaces of the plurality of fins.

5. The method of claim 1, further comprising providing a plurality of gate structures over the exposed upper fin portions of the plurality of fins to facilitate forming a plurality of FinFET structures, wherein a uniform channel size of the plurality of FinFET structures is defined by the uniform exposure height of the upper fin portions of the plurality of fins.

6. The method of claim 1, further comprising removing at least a portion of one or more of the plurality of fins following uniformly recessing the dielectric material, the removing forming one or more trenches in the substrate.

7. The method of claim 6, wherein the removing comprises etching through at least a portion of one or more of the plurality of fins and a portion of the substrate to form the one or more trenches.

8. The method of claim 6, wherein the dielectric material is a first dielectric material, the method further comprising providing a second dielectric material, the second dielectric material filling the one or more trenches to form one or more isolation trenches of the one or more circuit structures.

9. The method of claim 8, further comprising recessing the second dielectric material, wherein the recessing does not further recess the first dielectric material.

10. The method of claim 9, further comprising providing a protective film over the exposed upper fin portions of the plurality of fins and the first dielectric material prior to providing the second dielectric material, wherein the protective film protects the first dielectric material during the recessing of the second dielectric material.

11. The method of claim 10, wherein the second dielectric material comprises an oxide material and the protective film comprises a nitride material resistant to the recessing of the second dielectric material.

12. The method of claim 10, wherein the removing at least a portion of one or more of the plurality of fins further comprises removing a portion of the protective film over the at least a portion of the one or more of the plurality of fins.

13. The method of claim 10, wherein recessing the second dielectric material comprises recessing the second dielectric material to a depth below the protective film.

14. The method of claim 10, further comprising planarizing the second dielectric material with an upper surface of the protective film over the plurality of fins prior to recessing the second dielectric material.

15. The method of claim 14, wherein planarizing the second dielectric material with the upper surface of the protective film comprises a chemical-mechanical polishing terminating when the second dielectric material is co-planar with the upper surface of the protective film over the plurality of fins.

16. The method of claim 10, further comprising removing the protective film following recessing the second dielectric material to expose the upper fin portions of the plurality of fins.

17. The method of claim 1, wherein the dielectric material is an oxide material.

18. The method of claim 1, wherein uniformly recessing the dielectric material comprises reactive-ion etching the dielectric material.

* * * * *